United States Patent
Udupa et al.

(10) Patent No.: US 7,310,058 B2
(45) Date of Patent: Dec. 18, 2007

(54) REDUCING THE TIME TO CONVERT AN ANALOG INPUT SAMPLE TO A DIGITAL CODE IN AN ANALOG TO DIGITAL CONVERTER (ADC)

(75) Inventors: Anand Hariraj Udupa, Richardson, TX (US); Vikas Kumar Sinha, Bangalore (IN); Nitin Agarwal, Bangalore (IN); Visvesvaraya A. Pentakota, Bangalore (IN); Sandeep Oswal, Bangalore (IN)

(73) Assignee: Texas Instruments (India) Private Limited Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/160,859

(22) Filed: Jul. 13, 2005

(65) Prior Publication Data

US 2007/0013569 A1    Jan. 18, 2007

(51) Int. Cl.
*H03M 1/38* (2006.01)
(52) U.S. Cl. .................. 341/161; 341/155; 341/122
(58) Field of Classification Search ............... 341/118, 341/120, 122, 155, 161, 172
See application file for complete search history.

(56) References Cited

U.S. PATENT DOCUMENTS

| | | | | |
|---|---|---|---|---|
| 6,166,675 A | * | 12/2000 | Bright | 341/162 |
| 6,222,478 B1 | * | 4/2001 | Bright | 341/162 |
| 6,337,651 B1 | * | 1/2002 | Chiang | 341/161 |
| 6,369,744 B1 | * | 4/2002 | Chuang | 341/161 |
| 6,396,429 B2 | * | 5/2002 | Singer et al. | 341/155 |
| 6,441,769 B1 | * | 8/2002 | Nagaraj | 341/161 |
| 6,756,929 B1 | * | 6/2004 | Ali | 341/161 |
| 7,119,728 B2 | * | 10/2006 | Wada et al. | 341/155 |
| 2002/0175843 A1 | * | 11/2002 | Sonkusale et al. | 341/120 |
| 2005/0225462 A1 | * | 10/2005 | Tsai et al. | 341/120 |
| 2005/0225470 A1 | * | 10/2005 | Tsai et al. | 341/161 |

OTHER PUBLICATIONS

Sotirios Limotyrakis, Scott D. Kulchycki, David K. Su, and Bruce A. Wooley, "A 150-MS/s 8-b 71-mW CMOS Time-Interleaved ADC", IEEE Journal of Solid-State Circuits, May 2005, pp. 1057-1067 (10 Pages), vol. 40, No. 5.

* cited by examiner

*Primary Examiner*—Linh Nguyen
(74) *Attorney, Agent, or Firm*—Wade J. Brady, III; Frederick J. Telecky, Jr.

(57) ABSTRACT

A stage of a pipeline ADC which uses separate pairs of sampling network and amplifier (in a sample and hold circuit (SHA)) to provide inputs to quantizer (which generates a sub-code) and a switched capacitor network (implementing a DAC, a subtractor and amplification). Due to the use of separate components/paths to provide the input signal, the throughput performance of the ADC is enhanced.

2 Claims, 3 Drawing Sheets

REDUCING THE TIME TO CONVERT AN ANALOG INPUT SAMPLE TO A DIGITAL CODE IN AN ANALOG TO DIGITAL CONVERTER (ADC)

BACKGROUND

1. Field of the Invention

The present invention relates generally the design of analog to digital converters (ADC), and more specifically to a method and apparatus for reducing the time to convert an analog input sample to a digital code in an ADC.

2. Related Art

An ADC refers to a component which receives an analog sample as input and provides (generates) a digital code corresponding to strength of the analog signal at various time instances (samples) as output. In an embodiment, the digital code equals (Vi*2n/Vref), wherein Vi represents the voltage of the input (analog) sample, Vref the reference voltage, * and / representing the multiplication and division operations respectively.

There is a general need to reduce the time to convert analog samples to corresponding digital codes. By reducing such time, the overall speed (and thus the throughput performance) of operation of systems/devices incorporating ADCs, can be advantageously enhanced. One reason for the low speed of ADCs is illustrated below with examples.

FIG. 1 is a block diagram of a pipe line ADC in one embodiment. ADC 100 is shown containing sample and hold amplifier (SHA) 110, stages 120-1 through 120-S, and digital error correction block 130. Each block is described below in further detail.

SHA 110 samples the input analog signal received on path 101, and holds the voltage level of the sample on path 111 for further processing by stage 120-1. Digital error correction block 130 receives sub-codes from various stages (on paths 123-1 through 123-S respectively), and generates a digital code corresponding to the sample received on path 101. Various error correction approaches, well known in the relevant arts, may be used to correct any errors in the received sub-codes. The generated digital code is provided on path 139 as a final digital code corresponding to the voltage of a sample on the input analog signal at a particular time instant.

Each stage 120-1 through 120-S generates a sub-code (based on the reference signal Vref received on path 152) corresponding to a voltage level of an analog signal received as an input, and an amplified residue signal as an input to a (any) next stage. For example, stage 120-1 converts a voltage level on path 111 to generate a sub-code on path 123-1, and the amplified residue signal generated on path 112 is provided as an input to stage 120-2. A common reference signal Vref is provided to stages 120-1 through 120-S. FIG. 2 further illustrates (logical) components contained in each stage (described with reference to stage 120-1 only, for conciseness) of a pipe line ADC according to a known approach.

FIG. 2 depicts the details of SHA 110 and stage 120-1 in one embodiment. As shown there, SHA 110 contains sampling circuit 210 and SHA amplifier 220, and stage 120-1 contains DAC-subtractor circuit 240, flash-ADC 260 (an example implementation of a quantizer), and gain amplifier 280. Each component is described briefly below.

Sampling circuit 210 samples the signal received on path 101, and provides the samples to SHA amplifier 220 at specific time points (determined by a time clock, not shown). Sampling circuit 210 is often implemented using capacitors and switches, as is well known in the relevant arts. SHA amplifier 220 amplifies the samples received from sampling circuit 210, and holds the amplified values for a time duration based on the requirements (timing/accuracy requirements) of stage 120-1.

Flash ADC 260 generates a sub-code representing the voltage level of the input sample received on path 111, and the sub-code is provided to on path 123-1 to DAC-subtractor circuit 240 as well as digital error correction block 130. DAC-subtractor circuit 240 receives the input sample on path 111 and Vref on path 152, and generates a residue signal having a voltage level of (Vi−(digital-code*Vref/2n)), wherein n represents the number of bits in each sub-code, and (digital-code*Vref/2n) represents a voltage equivalent of the sub-code. Gain amplifier 280 amplifies the residue signal, and provides the amplified residue signal for processing in stages downstream.

Aspects of the present invention provide advantages such as increased throughput performance. The features can be appreciated by understanding the details of prior embodiments, which do not implement one or more of such features. Accordingly, the prior embodiments are described below with reference to FIGS. 3 and 4.

FIG. 3 depicts the further details of stage 120-1 in one embodiment assuming a 1-bit digital code is generated for simplicity. Flash ADC 260 is shown containing capacitor 310 and comparator 320, and switched capacitor amplifier 340 (which performs sampling of the input signal, subtracts the voltage equivalent of the digital code, and amplifies the result of subtraction, and thus containing both DAC-subtractor circuit 240 and gain amplifier 280) is shown containing capacitors 370 and 380, switches 360A-360C and 385, and operational amplifier (op-amp) 390. The components are described below in further detail.

First it is noted that, in order to avoid obscuring the features of the present invention, the description henceforth is provided with reference to single ended implementations. The extension of the approaches to differential circuits will be apparent to one skilled in the relevant arts by reading the disclosure provided herein, and such implementations are contemplated to be covered by various aspects of the present invention.

Capacitor 310 represents the input capacitance of flash-ADC 260. Capacitor 310 charges to the input sample voltage on path 111 when switch 315 is closed. Switch 315 is open after a pre-determined time duration intended to allow the capacitor to complete charging (in sampling phase, overlapping with the hold phase of SHA 110). Comparator 320 is then enabled to provide a comparison result of capacitor voltage (on 310) with Vref/2, as shown.

Capacitor 370 samples the input sample voltage on path 111 when switch 360A is closed. Switch 360A is opened after a pre-determined time duration intended to allow the capacitor to complete charging (in sampling phase). Switches 385, 360B and 360C are kept open during sampling phase. Once capacitor 370 is charged, switch 360A is opened and switch 385 is closed during the hold phase.

Only one switches 360B (to subtract Vref) and 360C (to subtract common mode reference, or ground in case of single ended operation) is closed based on the result of the output of flash-ADC 260, to achieve any needed subtraction. The difference of the sampled input voltage (during sampling phase) and Vref/CM is transferred to feedback capacitor 380. Op-amp 390 amplifies the difference (residue) based on ratio of the capacitance of capacitors 380 and 370. The amplified residue signal is provided to the next stage 112.

While the embodiments of above provide the desired digital value corresponding to a sampled input voltage, there may be several disadvantages with the related approach. For example, SHA amplifier 220 may need to be implemented to support two components of loads, i.e., from flash ADC 260 and DAC subtractor circuit 240. SHA amplifier 220 needs to be implemented with a high accuracy, consistent with the requirements of DAC-substractor 240, even though flash ADC may tolerate lesser accuracy. Driving such high load as well as providing a high accuracy, often presents design challenges and may be undesirable at least in some environments.

Another disadvantage with such a system is low throughput performance, as described below with respect to the timing diagram of FIG. 4. Signals 401 and 402 respectively represent the sampling and hold phases in SHA 110. Signals 420, 430 and 460 respectively represent the operation of switches 315, 360A, and 360B/360C. Signal 440 represents the duration in which flash-ADC 260 determines the sub-code. The timing relationship between these signals is described below in detail.

Input signal 101 is sampled (by SHA 110) between time points 411 and 412. SHA amplifier 220 holds the sampled and amplified signal on path 111 between time points 413 (following immediately after time point 412) and 414. Switches 315 and 360A are closed between time point 413 and 414, causing capacitors 310 and 370 to store charge proportionate to sampled input voltage. Thus, time duration between 413 and 414 represents the sampling duration of both flash ADC 260 and DAC-subtractor circuit 240.

Flash ADC 260 generates the sub-code by comparing the relevant signals in time duration 441-442. Time point 441 may start after time point 414 since earlier opening of switch 315 causes noise at the input of capacitor 370 (which is undesirable at least to the high precision requirements for DAC-subtractor circuit 240 in the signal path). Thus, sub-code value corresponding to the sampled value at time point 414 is available after time point 442 for use by DAC-subtractor circuit 240.

Thus, switches 360B or 360C can be closed after time point 442. Accordingly, the desired amplification is shown occurring between time points 462 (following 442) and 463. The amplified residue signal is made available to the next stage 120-2 following time point 463. Hence, the total processing time consumed by stage 120-1 is duration 413-463, which may approximately equals the sum of sampling phase duration 413-414, sub-code generation duration 441-442, and DAC-subtractor hold time 462-463.

As noted above, it is often desirable to provide ADCs of high throughput performance and thus it may be desirable to reduce the processing time of each ADC stage. Accordingly, what is needed is a ADC architecture which meets one or more of the requirements noted above.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit (s) in the corresponding reference number.

DETAILED DESCRIPTION

1. Overview

According to an aspect of the present invention, a quantizer (of a stage of an ADC) is operated with lesser sampling duration compared to a sampling duration of a switched capacitor amplifier. Thus, the quantizer can generate the sub-code correspondingly (i.e., to the lesser sampling duration) sooner and the processing time of the stage may also be correspondingly reduced, thereby enhancing the throughput performance of the ADC.

The lower sampling duration may be acceptable for the quantizer since the precision requirements (due to quantization) of quantizer are lower. On the other hand, the higher sampling duration for the switched capacitor amplifier provides a correspondingly higher settling time, enabling greater accuracy in the operation of the switched capacitor amplifier. Thus, the higher throughput performance may be attained without compromising on the resolution of the ADC stage.

In one embodiment, such a feature is attained by using two separate sample and hold amplifiers (SHA), one to drive the quantizer and the other to drive the switched capacitor amplifier. Since the sampling durations on the two paths are different, each SHA can be designed to suit the specific requirements of the corresponding path. For example, since the switched capacitor amplifier has longer duration to sample (and thus for the signal to settle), the drive requirements (gain/power gain) of SHA are reduced/relaxed, thereby leading to design simplicity.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Novel Architecture

Figure 1:
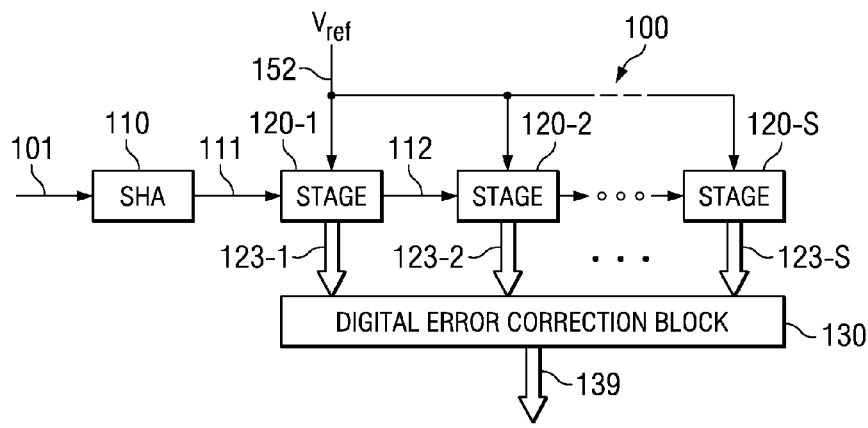
FIG. 1 is a block diagram illustrating the internal structure of an example prior multistage ADC.
Figure 2:
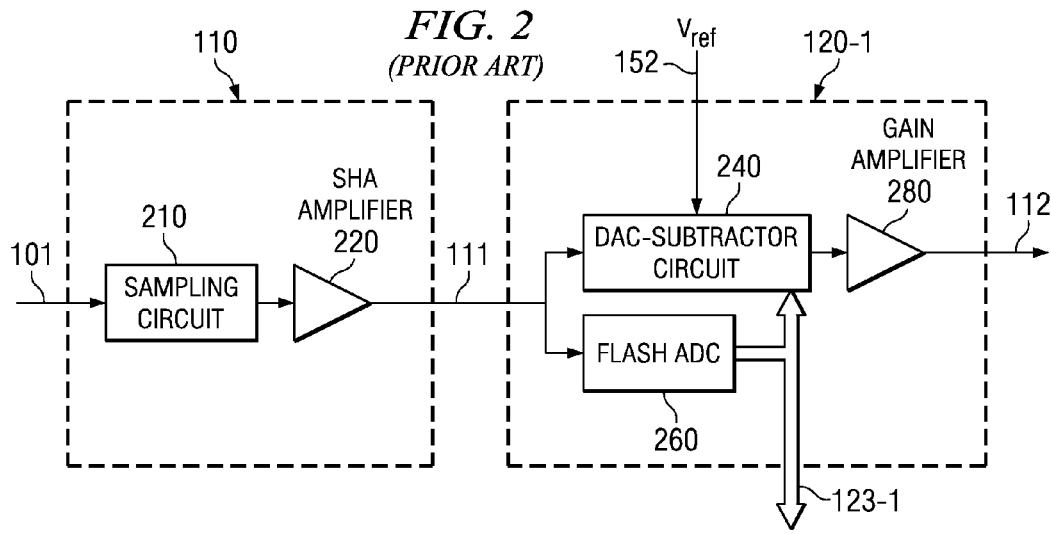
FIG. 2 is a block diagram illustrating the general operation of a stage of a prior ADC.
Figure 5:
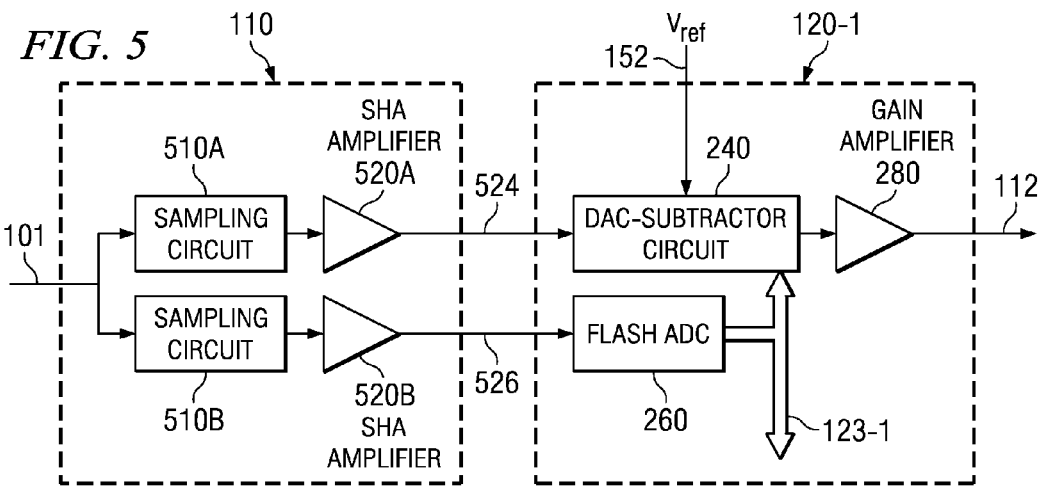
FIG. 5 is a block diagram illustrating the implementation of a stage of an ADC in an embodiment of the present invention.

FIG. 5 is a block diagram illustrating the details of SHA 110 and stage 120-1 in an embodiment of the present invention. SHA 110 is shown containing sampling circuits 510A and 510B, SHA amplifiers 520A and 520B, and stage 120-1 contains DAC-subtractor circuit 240, flash-ADC 260, and gain amplifier 280. For conciseness, the same components (along with associated numbering) of FIG. 2 are used in FIG. 5 also, and only the differences are described below.

The combination of sampling circuit 510A and SHA amplifier 520A, may respectively be implemented similar to sampling circuit 210 and SHA amplifier 220. The combination receives the input sample on path 101 and generates the amplified sample on path 524. However, the drive (gain) requirement of SHA amplifier 520A can be smaller compared to SHA amplifier 220 (since the SHA amplifier 520A need not drive flash ADC 260).

The combination of sampling circuit 510B and SHA amplifier 520B, may also respectively be implemented similar to sampling circuit 210 and SHA amplifier 220. The combination receives the input sample on path 101 and generates the amplified sample on path 526. However, the gain (drive requirement) of SHA amplifier 520B and precision requirement can be smaller/lower compared to SHA amplifier 220 (since SHA amplifier 520B need not drive DAC subtractor circuit 240).

Figure 3:
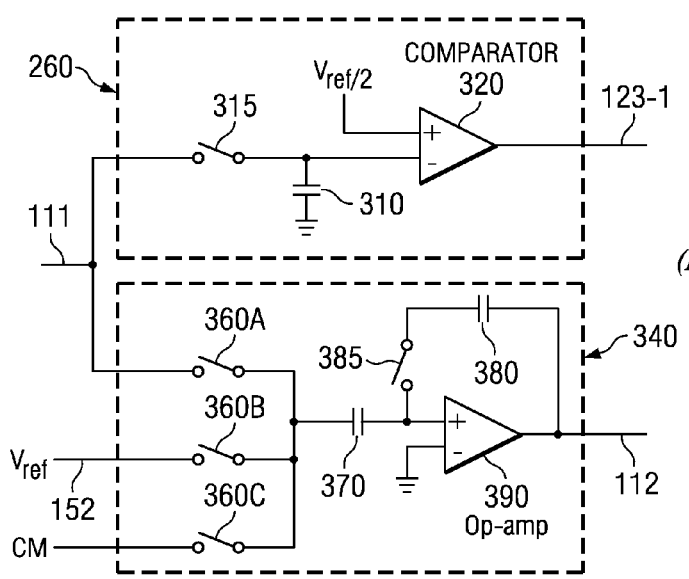
FIG. 3 is a circuit diagram of the implementation of a prior switched capacitor circuit containing a DAC, residue amplifier and a subtractor.
Figure 6:
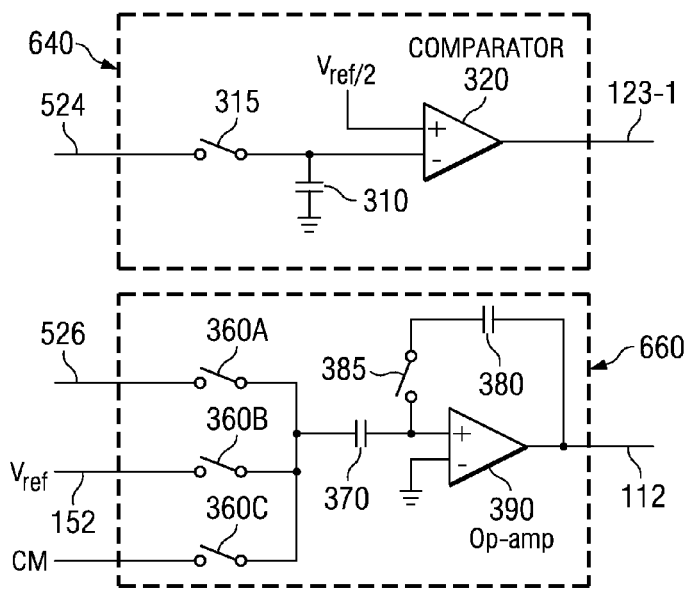
FIG. 6 is a circuit diagram illustrating the implementation of a switched capacitor circuit (containing DAC, residue amplifier and a subtractor) of a stage in an embodiment of the present invention.
Figure 7:
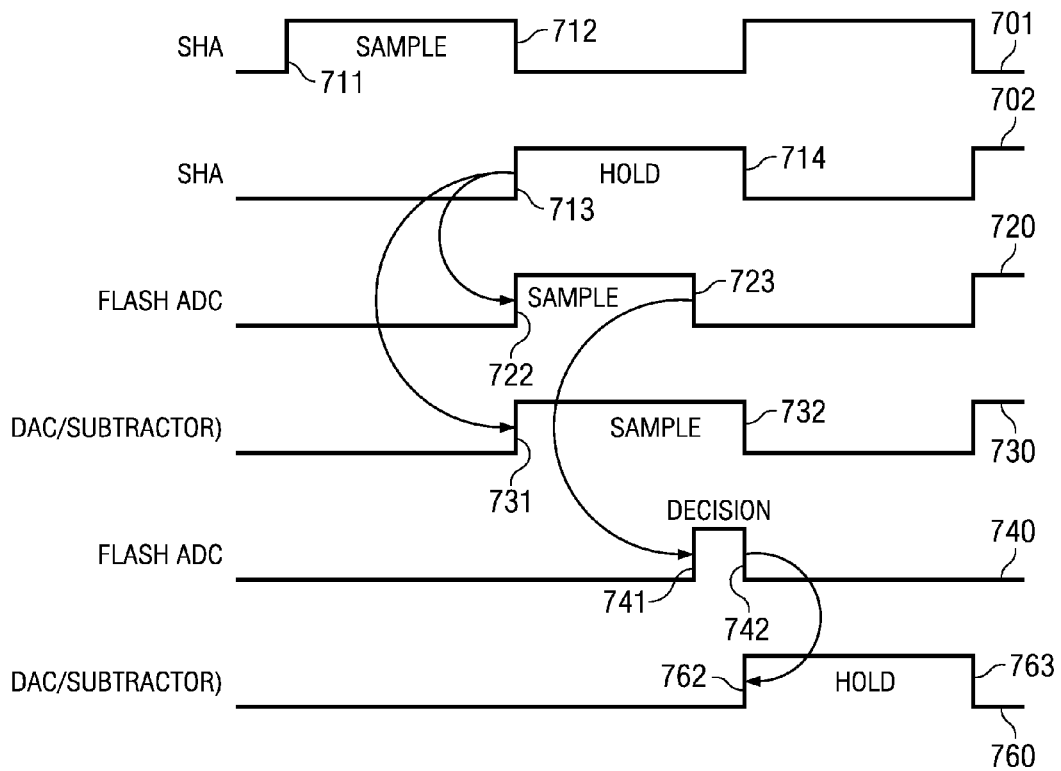
FIG. 7 is a timing diagram of various signals illustrating the higher throughput performance attained due to various aspects of the present invention.

The enhanced throughput performance due to such an approach can be appreciated by considering the internal details of stage 120-1, as described with respect to FIGS. 6 and 7. As may be readily appreciated, the flash ADC 640 and switched capacitor amplifier 660 of FIG. 6 are respectively similar to corresponding components 340 and 360 of FIG. 3 except that the inputs are received on separate paths 524 and 526 (instead of a common path 111 in FIG. 3).

Accordingly, switch 315 is shown connecting signal 524 to capacitor 310 (in the sampling phase) and switch 360A is shown connecting signal 526 to capacitor 370. Due to the use of separate paths, switches 315 and 360A can be operated independently without causing noise interference in the signal path. Switch 315 can thus advantageously be opened sooner than switch 360A, to attain higher throughput performance as described below with respect to FIG. 7.

3. Timing Diagram

FIG. 7 is a timing diagram illustrating the operation of the circuits of FIGS. 5 and 6 in further detail. Signal 701 represents the sample phase of both sampling circuits 510A and 510B, and signal 702 represents the hold phase of both SHA amplifier 520A and 520B. Thus, both sampling circuits sample input signal 101 between time points 711 and 712, and SHA amplifiers 520A and 520B hold the respective amplified signals between time points 713 and 714. However, the sampling and hold durations on these two paths can be different as well.

Signal 720 represents sampling duration of flash ADC 640, and the sampling operation is shown between time points 722 (starting after 713) and 723. Signal 730 represents the sampling duration of switched capacitor amplifier circuit 660 and is shown between time points 731 (also starting after 713) and 732. It should be appreciated that time point 723 can be much earlier compared to time point 732 due to separate paths 524 and 526.

Accordingly, the sub-code generation decision (on signal 740) is shown starting immediately after time point 723. The decision duration is shown between time points 741 and 742, overlapping with sampling duration 731-732 of switched capacitor amplifier circuit 660. Due to the overlap, the sub-code values can be available potentially before start of amplification/hold phase (in duration 762-763 on signal 760) of switched capacitor amplifier 660.

Figure 4:
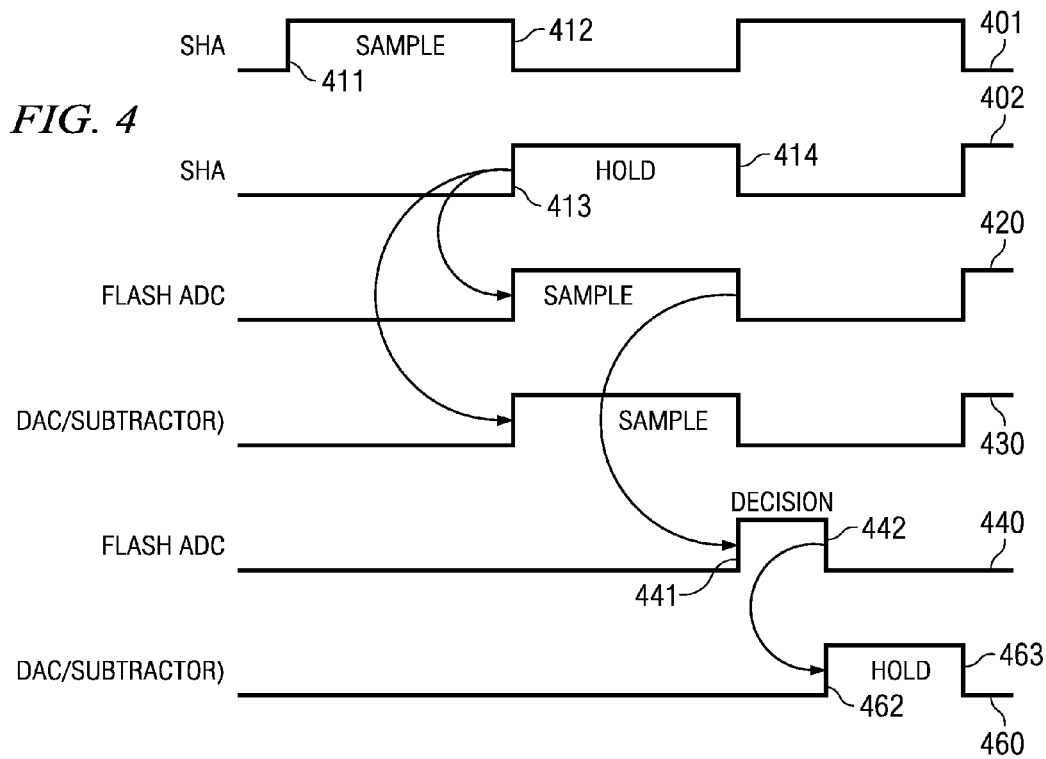
FIG. 4 is a timing diagram of various signals in a prior embodiment used to illustrate the higher throughput performance attained due to various aspects of the present invention.

The total processing time in the circuits of FIGS. 5 and 6 thus is duration between time points 731 and 763, which equals sampling duration 731-732 and hold duration 762-763. In comparison to the embodiment described above with respect to FIGS. 3 and 4, the processing time in stage 120-1 is reduced potentially by the time taken for sub-code generation (i.e., duration 441-442).

While the description above is shown enhancing the throughput performance of stage 120-1 only, it should be appreciated that a similar technique (i.e., using SHA such as the one described above, in between each pair of stages) can be applied to enhance the throughput performance of other stages as well. As a result, the throughput performance of ADCs may be enhanced.

The embodiment(s) of above can be implemented in various devices/systems. The description is continued with respect to an example device in which various aspects of the present invention are implemented.

4. Device

Figure 8:
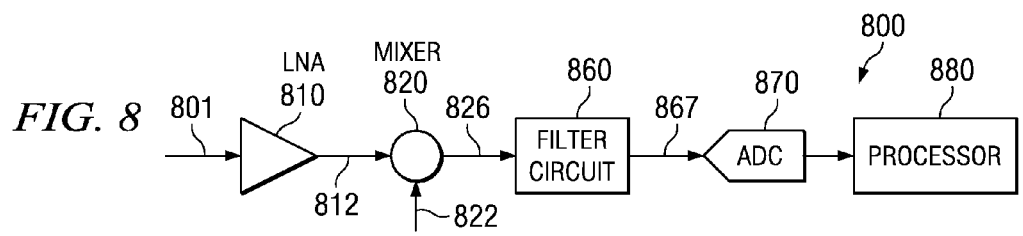
FIG. 8 is a block diagram illustrating the details of implementation of a device in an embodiment of the present invention.

FIG. 8 is a block diagram of receiver system 800 illustrating an example system in which various aspects of the present invention may be implemented. For illustration, it is assumed that receiver system 800 is implemented within a Wireless Receiver. However, receiver system 800 can be implemented in other devices (wireless as well as wire-based communications) as well.

Receiver system 800 is shown containing low noise amplifiers (LNA) 810, mixer 820, filter circuit 860, analog to digital converter (ADC) 870, and processor 880. Each block/stage is described in further detail below.

LNA 810 receives signals on path 801 and amplifies the received signals to generate a corresponding amplified signal on path 812. For example, in wireless systems, the signals that are transmitted from satellites, etc. may be received by an antenna (not shown) and the received signals are provided on path 801. The received signals may be weak in strength and thus amplified by LNA 810 for further processing. LNA 810 may be implemented in a known way.

Mixer 820 may be used to down-convert the received amplified signal on path 812 into an intermediate signal with the frequency band of interest centered at a lower frequency than the carrier frequency of the received signal. In an embodiment, a signal with the frequency band of interest centered at 2.4 GHZ (carrier frequency) is converted to a signal with the frequency band of interest centered at zero frequency.

Mixer 820 may receive the amplified signal on path 812 and a signal of fixed frequency on path 822 as inputs, and provides the intermediate signal on path 826. The signal of fixed frequency on path 822 may be generated by a phase locked loop (not shown) in a known way.

Filter circuit 860 may correspond to a low pass filter, which allows the desired low frequencies and rejects all other unwanted high frequencies present in the signal received on line 826. The filtered signal, which contains the frequency band of interest, is provided on path 867.

ADC 870 converts (samples) the filtered signal received on path 867 to a corresponding digital value, which represents the signal of interest in received signal 801. Processor 880 processes the received digital values to provide various user applications and may be implemented as multiple processing units, each potentially operating independently. ADC 870 may correspond to ADC 100 described in sections above (and implemented according to various aspects of the present invention).

5. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An analog to digital converter (ADC), comprising:
   a first sampling circuit sampling an input signal;
   a first amplifier receiving said sampled input signal from said first sampling circuit, and providing an amplified version of said sampled input signal as an output;
   a quantizer sampling said output of said first amplifier for a first duration, and generating a sub-code representing a voltage of said input signal;
   a second sampling circuit sampling said input signal;
   a second amplifier receiving said sampled input signal from said second sampling circuit, and providing an amplified version of said sampled input signal as an output; and
   a first circuit sampling said output of said second amplifier for a second duration, said first circuit generating an amplified residue signal for processing by a next stage also comprised in said ADC;
   wherein said first duration is less than said second duration; and
   wherein said quantizer determines said sub-code in a decision duration which overlaps with said second duration.

2. The ADC of claim 1, wherein said first circuit comprises a plurality of capacitors, a plurality of switches and an amplifier together sampling said input signal and amplifying a difference of said strength and a voltage equivalent of said sub-code to generate said amplified residue signal.

* * * * *